United States Patent [19]

Yamawaki et al.

[11] Patent Number: 4,642,467
[45] Date of Patent: Feb. 10, 1987

[54] ELECTRON BEAM IRRADIATION APPARATUS

[75] Inventors: Masakatsu Yamawaki, Ikeda; Isamu Sakamoto, Kyoto; Kenichi Mizusawa, Ibaraki; Eiji Iwamoto, Kyoto, all of Japan

[73] Assignee: Nissin-High Voltage Co., Ltd., Kyoto, Japan

[21] Appl. No.: 681,117

[22] Filed: Dec. 13, 1984

[30] Foreign Application Priority Data

Dec. 16, 1983 [JP] Japan .................................. 58-238510

[51] Int. Cl.⁴ .............................. G01K 1/08; H01J 3/00
[52] U.S. Cl. .................................. 250/492.3; 250/400; 427/44
[58] Field of Search .......................... 250/492.3, 400; 219/121 EB, 121 EM, 123; 427/44, 48

[56] References Cited

U.S. PATENT DOCUMENTS

| | | | |
|---|---|---|---|
| 2,897,365 | 7/1959 | Dewey et al. | 250/400 |
| 3,104,321 | 9/1963 | Smith | 250/400 |
| 3,117,065 | 1/1964 | Wootten | 427/48 |
| 4,112,307 | 12/1978 | Föll et al. | 250/492.3 |
| 4,308,446 | 12/1981 | Okane et al. | 219/123 |
| 4,407,853 | 10/1983 | Okita et al. | 427/44 |
| 4,482,578 | 11/1984 | Akashi et al. | 427/44 |

FOREIGN PATENT DOCUMENTS 2341040 2/1975 Fed. Rep. of Germany ... 250/492.3

Primary Examiner—Bruce C. Anderson
Attorney, Agent, or Firm—Stiefel, Gross, Kurland & Pavane

[57] ABSTRACT

An electron beam irradiation apparatus comprising an electron beam source which is capable of generating an electron beam and irradiating in one direction, a first magnet member having a through hole and being disposed to allow the electron beam irradiated from said electron beam source to pass therethrough, a second magnet member which is disposed opposing to the first magnet member through a gap which allows a target to pass therethrough and has the polarity different from that of the first magnet member, a target supporting/-shifting means which allows the target to pass through said gap and cooling means which cools said both magnet members. A base material coated with a paste of magnetic particles is used as the target and vertical orientation of the magnetic particles and hardening of the paste can be simultaneously conducted.

10 Claims, 9 Drawing Figures

ELECTRON BEAM IRRADIATION APPARATUS

BACKGROUND OF THE INVENTION

1. Field of the Invention

The present invention relates to an electron beam irradiation system to be used for forming a vertically magnetized layer on a tape, disk and sheet, etc. In more detail, the present invention relates to a beam irradiation apparatus for fixing magnetic particles oriented vertically on a tape, web or sheet by the electron beam irradiation, and a method for manufacturing a vertically magnetized layer.

2. Description of the Prior Art

In the existing manufacturing method of magnetic tape, etc., a magnetic paste obtained by dispersing magnetic particles into a solution with an adequate additive is applied on a substrate such as a plastic film, etc. as a magnetic layer, such substrate is caused to pass through a repulsive magnetic field formed by opposingly disposing the magnets of the same polarity before such coated magnetic layer is hardened, the axis of easy magnetization of magnetic particles is set in parallel to the moving direction of film used as the base material by the magnetic field orientation process. Thereafter, such paste is hardened by heat or electron beam irradiation. A magnetic film thus obtained is so-called a horizontal magnetic film. However, the limited magnetic recording density of such horizontal magnetic film is no longer sufficient in a medium of high density recording which is required with recent progress in electronics technology.

Therefore, the vertical magnetic film is attracting attention as a medium which realizes high density recording. Namely, in a vertical magnetic film, the axis of easy magnetization of magnetic particles is oriented vertically to the surface of base material and thereby, recording density can be enhanced dramatically.

As methods of manufacturing a vertically magnetized film, there are the method disclosed in Japanese Patent Laid-open No. 68826/1984 (published on April 18th, 1984) and a so-called sputtering method using a magnetron sputter system. However, in the method of Japanese Patent Laid-Open No. 68816/1984, the film is hardened after vertical orientation of magnetic particles and therefore orientaton sometimes becomes irregular. Also, the sputtering method is essentially a batch processing and is not suited to continuous manufacture. In addition, the vertical magnetic film obtained by the sputter method can not be said to have sufficient performance from the point of view of surface smoothness, etc.

SUMMARY OF THE INVENTION

It is an object of the present invention to provide an apparatus and the method thereof for simply and continuously manufacturing a high quality vertical magnetic film.

The present invention provides a method of manufacturing a vertical magnetic film wherein a substrate is caused to pass through a magnetic field formed by magnets having different polarities disposed opposingly while its magnetic flux is formed vertical to the surface of substrate before a coated magnetic layer formed by coating a base material with a magnetic paste where magnetic particles are dispersed is hardened, the axis of easy magnetization of magnetic particles is vertically oriented to the moving direction of base mateiral film and such paste is hardened by the electron beam in such a condition.

As an apparatus for preferably realizing this method, the present invention provides an electron beam irradiation appartus comprising an electron beam source which is capable of generating an electron beam and irradiating in one direction, a first magnet member having a through hole disposed so that the electron beam irradiated from the electron beam source passes through such through hole, a second magnet member which is opposed to the first magnet member through a gap allowing a target to pass and having a polarity different from that of the first magnet member, a target supporting/shifting means for allowing the target to pass through the gap and a cooling means for cooling said both first and second magnet members.

Moreover, the present invention provides an electron beam irradiation apparatus comprising an electron beam source which generates an electron beam and irradiates in one direction, a first magnet member which is disposed near one side of the electron beam source, a second magnet member which is opposed to the first magnet member through a gas which allows a target to pass and has different polarity, a target supporting/shifting means which supports and shifts the target toward said electron beam source and the center plane of said gap and a cooling means which cools at least said second magnet member.

The electron beam irradiation apparatus of the present invention is capable of continuously forming a high quality vertical magnetic film because a magnetic layer is hardened by electron beam irradiation within a magnetic field where magnetic particles of unhardened magnetic layer are vertically oriented. Accordingly the apparatus of the present invention is very effective as an apparatus for manufacturing a vertically magnetized film or disk for industrial use which is attracting attention as a high density magnetic recording medium.

DESCRIPTION OF THE PREFERRED EMBODIMENT

Figure 1:
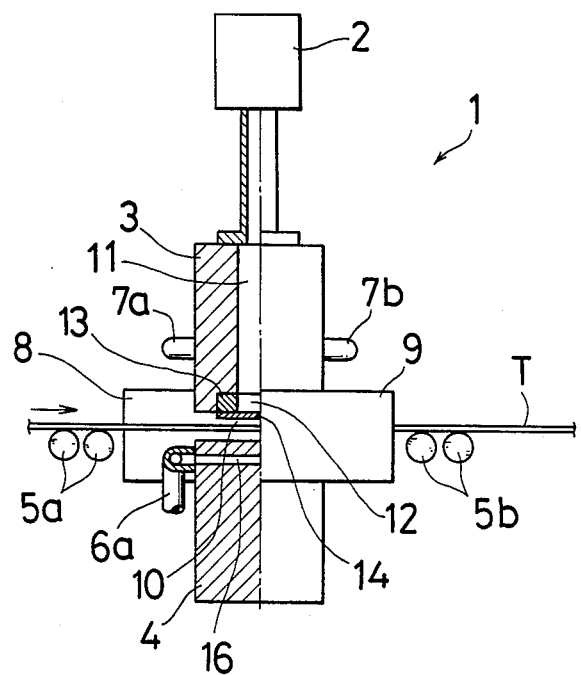
FIG. 1 is a side view including a partial cross section of an embodiment of the electron beam irradiation apparatus to which the present invention is applied.
Figure 2:
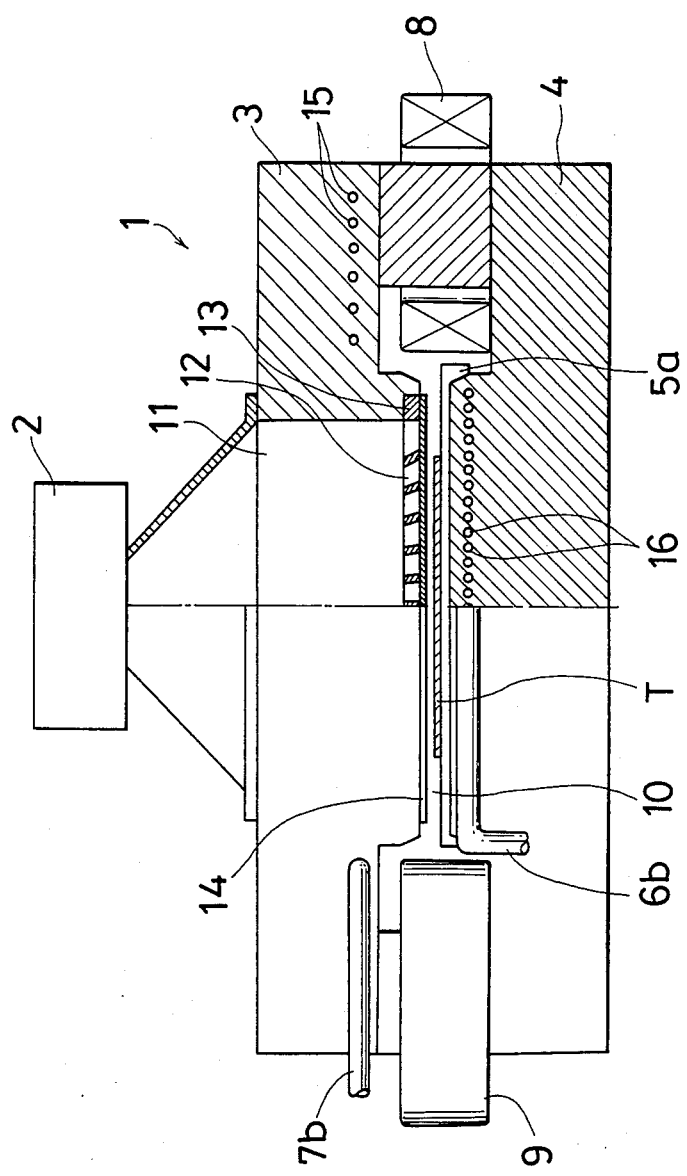
FIG. 2 is a front view including a partial cross section of the apparatus shown in FIG. 1.
Figure 3:
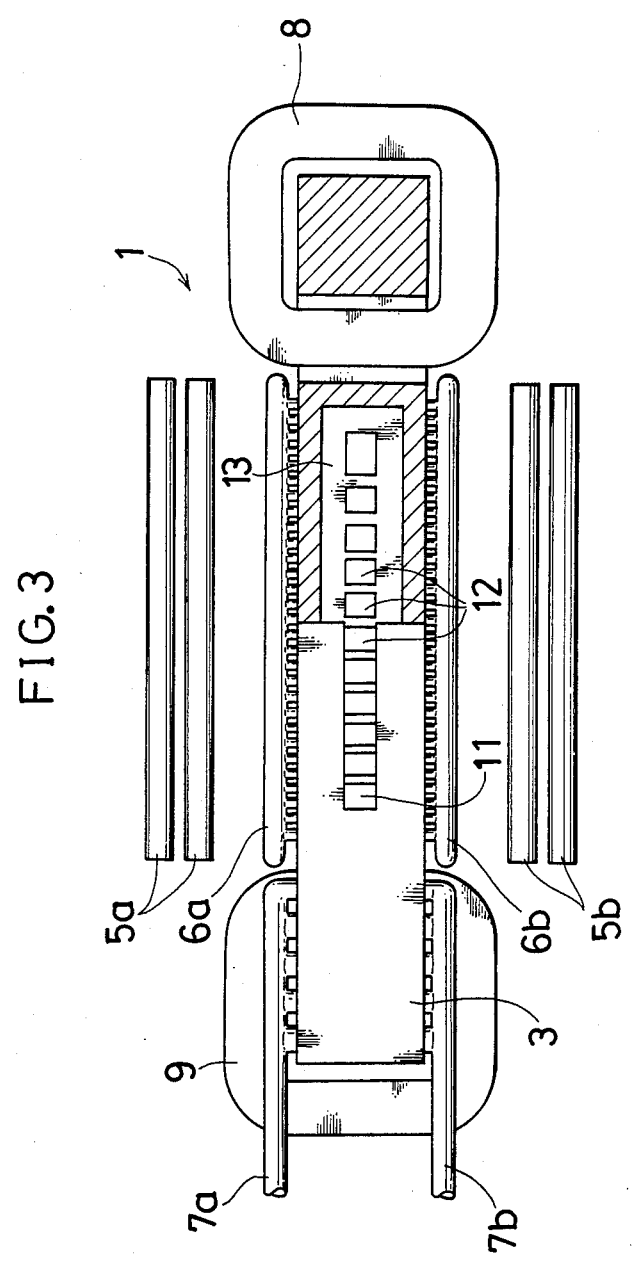
FIG. 3 is a plan view including a partial cross section of the apparatus shown in FIG. 1.

In FIG. 1 to FIG. 3, (1) is an embodiment of electron beam irradiation apparatus of the present invention, comprising an electron beam source (2), a first magnet member (3), a second magnet member (4), film supporting/shifting means, i.e., rollers (5a) (5b) and cooling means, i.e., coolant pipes (6a) (6b) (7a) (7b).

As an electron beam source (2), any of electron beam irradiation devices of the prior arts having an accelerator such as the Van de Graaff type, Cockcroft Walton type, transformer type or high frequency acceleration type may be used, without any particular limitation. However, it is preferable to use the device which assures irradiation of electron beam with an acceleration energy of 150 KeV to 1000 KeV and electron current of 10 mA to 200 mA or more. From the point of view of the shape of electron beam, the electron beam irradiation devices can be sorted into two kinds. One is the scanning type where the belt shaped electron beam can substantially be obtained by scanning the elliptic beam spot of several millimeters and the other is the nonscanning type where the belt shaped electron beam is directly obtained using the line shaped filament. Any kind of apparatus may be employed.

The first magnet member (3) and the second magnet member (4) are electromagnets which excite the soft iron core with excitation coils (8) (9). Excitation coils may be installed around the center pole piece being provided with means to avoid electron irradiation. In a gap (10) formed by opposing magnets, a magnetic field as high as 500–20,000 Gauss, preferably 5,000–8,000 Gauss is formed. The magnet members (3), (4) may have the N-pole or S-pole, so long as these are different in the polarities. The magnet members (3), (4) may be permanent magnets.

The first magnet member (3) is provided with a bored through hole (11) which allows the electron beam to pass and a magnetic field shaping grill (13) having many apertures (12) is attached to the electron beam exit side of through hole (11). In case the electron beam is guided so that it can be transmitted through the through hole (11), position of the electron beam source (2) and the first magnet member (3) is not restricted but it is desirable that the electron beam source (2) be disposed on the extended line of the through hole (11) of the first magnet member (3).

The grill (13) of through hole (11) is further provided with a metal foil (14). For example, the metal foil (14) is made of titanium or titanium alloy in a thickness of 10–50 μm or aluminum or aluminum alloy foil in a thickness of 10–100 μm. This metal foil vacuumly seals an electron flight space between the electron beam source (2) and the through hole (11). Outside of the metal foil (14), the area irradiated by the electron beam is exposed to air an inert gas such as nitrogen gas, rare gas or halogen gas. Moreover, the area to be irradiated with electron beam may be in vacuo. In case the area to be irradiated with the electron beam is under vacuum, the metal foil (14) may be eliminated because it is no longer necessary to provide separate vacuum sealing with that foil.

An aperture area in the grill (13) is designed so that 20% or more, preferably 30–100%, of the electron beam irradiated from the electron beam source (2) is transmitted to the area to be irradiated with electron beam. The shape of individual apertures (12) may be any shape of circle, rectangular, polygon or ellipse and it is desirable that individual aperture diameter be smaller than the height of the gap (10) from the point of view of magnetic field shaping characteristic. As a practical example, when the height of gap (10) is 5–100 mm, the aperture is formed as a square having a side of 3–50 mm. The number of apertures (12) is uniquely determined from the aperture area but usually about 1–500 apertures are formed.

The tape supporting/shifting rollers (5a) (5b) support and shift a tape (T) while it is positioned at the symmetrical surface the of magnetic field of the gap (10).

The coolant pipes (6a) (6b) and (7a) (7b) cool the magnetic members (3) (4) by allowing a refrigerant, for example, pure water, freon, etc. to flow into a cooling hole (15) provided to the first magnet member (3) and a cooling hole (16) provided to the second magnet member (4).

An example of manufacturing vertical magnetic film is explained hereinafter.

In manufacture of vertical magnetic film, a magnetic paste dispersing magnetic particles is applied on a base material such as plastic film to form the magnetic layer. Before hardening of such magnetic layer is completed, such magnetic particles are oriented for the vertical magnetic field by said electron beam irradiation apparatus (1). Simultaneously, such magnetic layer is hardened by electron beam irradiation.

As the magnetic particles, those which are suited to orientation for vertical magnetic field, for example, barium ferrite, $\gamma$-$Fe_2O_3$, $\gamma$-$Fe_2O_3$ coated with Co, and $CrO_2$, etc. may be used.

The magnetic paste may be prepared by using a solution which is mainly composed of an unsaturated resin and a monomer which are hardened by electron beam irradiation and contains a small amount of a dispersant.

As the unsaturated resins, unsaturated polyester, acrylic polyester and unsaturated epoxy resin, etc. may be used. As the monomers, acrylic acid ester, methacrylic acid ester, and vinyl hydrocarbon, etc. may be used.

As the base material mentioned above, a base material which can be used as the carrier of magnetic layer of magnetic recording body may be used without any restriction on material and shape. For example, a plastic film such as polyester, polyacetate, polyvinylchloride and polyimide, etc. or vinylchloride resin plate, polyester resin plate and polymethylmethacrylate resin plate, etc. which are used for magnetic disks may be used.

As a method of coating the base material with the magnetic paste dispersing magnetic particles, a doctor blade method, reverse roll method, photogravure roll method and spinner method, etc. may be used. A coating apparatus which is usually used in this field may be freely employed. The layer is formed in the thickness of about 100 μm maximum.

Here, a practical embodiment is mentioned. For example, the magnetic paste, where needle-shaped ferromagnetic ferric oxide (with a long axis of 1 μm or less) is dispersed uniformly into a solution consisting of solvent mainly composed of unsaturated polyester resin and acrylic acid ester, a stabilizer, a dispersant, an antistatic agent, a lubricant and a coloring agent, is applied, by the doctor blade method, on a polyester tape in the width of 15 cm–2 m which is precoated in the thickness of 5 μm–30 μm, thereby forming the magnetic layer film in the thickness of 1 μm–10 μm. The tape (T) thus obtained is caused to run through the gap (10) by the tape supporting/shifting rollers (5a) (5b) while the film (2) is not yet hardened at the rate of 50 m/min–300 m/min, preferably at the rate of 100 m/min. Thereby, the magnetic field perpendicular to the magnetic layer film of tape (T) works on the tape and the axis of easy magnetization of the magnetic particles is oriented vertically to the running direction of tape (T). Simultaneously the film (2) is hardened by the electron beam irradiation, the vertical orientation is fixed and thereby the tape (T) forming suitably the vertical magnetization film can be manufactured continuously. The preferable amount of electron beam is 20 (kGy)-100 (kGy).

The electron beam partly collides with the first magnet member (3), the grill (13) and the metal foil (14), or transmits through the tape (T) and collides with the second magnet member (4). Therefore, the magnet members (3), (4) generate heat and are cooled by the refrigerant which flows through the coolant pipes (6a) (6b), (7a) (7b).

Figure 4:
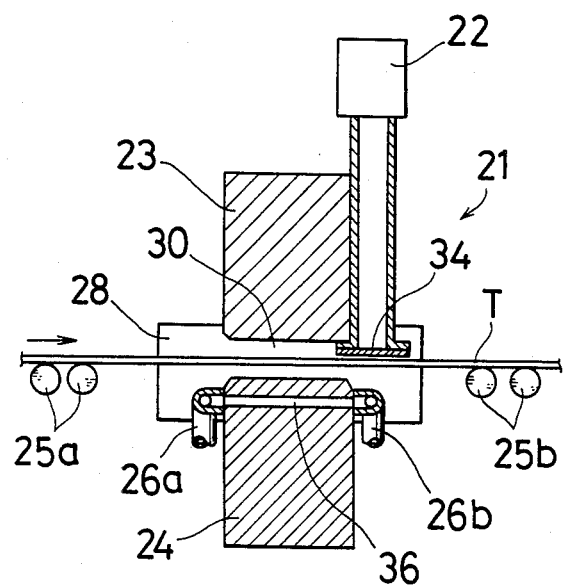
FIG. 4 is another embodiment equivalent to FIG. 1.
Figure 5:
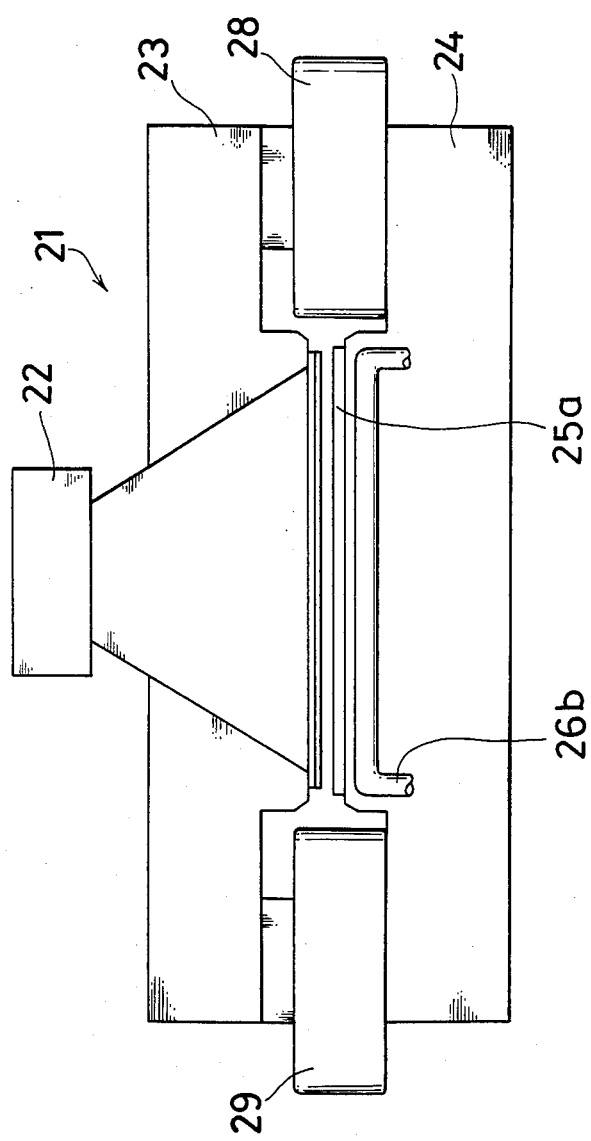
FIG. 5 is another embodiment equivalent to FIG. 2.
Figure 6:
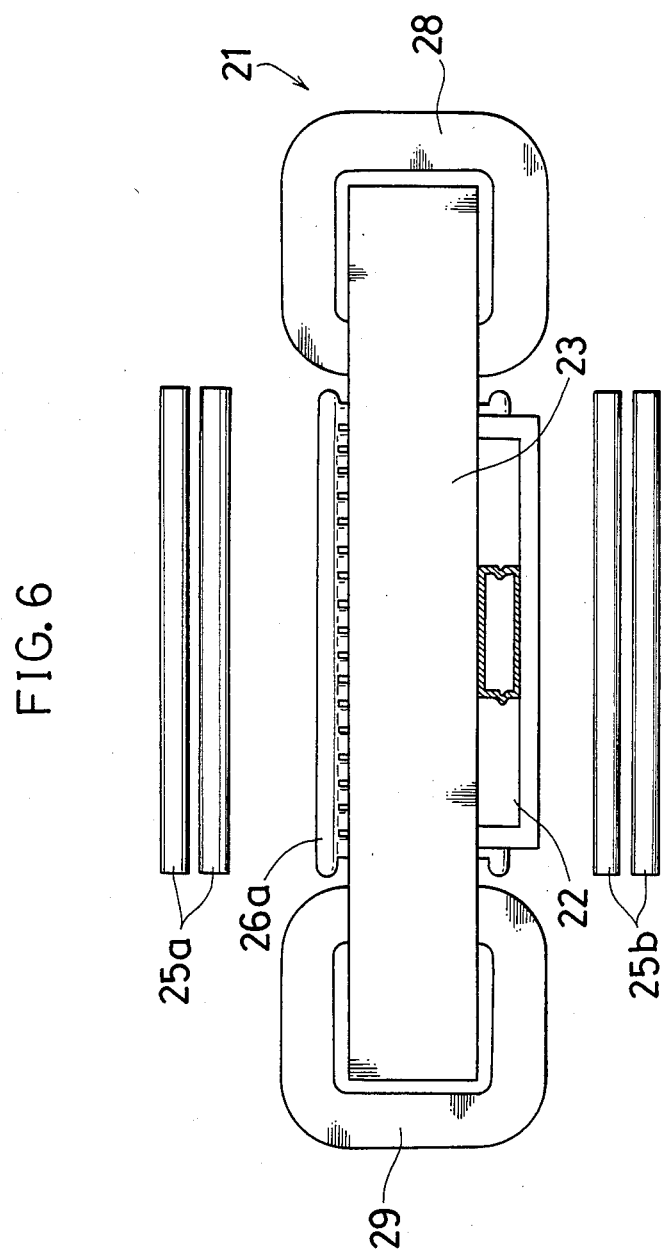
FIG. 6 is another embodiment equivalent to FIG. 3.

In FIG. 4 to FIG. 6, (21) is another emboidment of the electron beam irradiation apparatus of the present invention. This embodiment provides an electron beam source (22), first magnet member (23), second magnet member (24), film supporting/shifting rollers (25a) (25b) and coolant pipes (26a) (26b).

The electron beam source (22) is the same as the electron beam source (2) in its construction but is different in the position of the magnet members. Namely, the electron beam source (22) is provided at the area near the single side of magnet members (23), (24). The internal space of the electron beam source (22) vacuumly sealed by metal foil (34) is at high vacuum i.e., in $10^{-4}$-$10^{-7}$ Torr.

The first magnet member (23) and second magnet member (24) are basically the same as the first magnet member (3) and the second magnet member (4). However, the through holes such as the hole (11) of said first magnet member (3), is not provided in this first magnet member (23). It may be sometimes allowed that the cooling means is not provided in the first magnet member (23) because it generates less heat due to fewer collisions of the electron beam due to its position but the second magnet member (24) generates a considerable amount of heat due to the scattered electron beam. Accordingly, a cooling hole (36) is provided and the second magnet member (24) can be cooled by a refrigerant which flows from the coolant pipes (26a), (26b). (28), (29) indicate the excitation coils.

Figure 7:
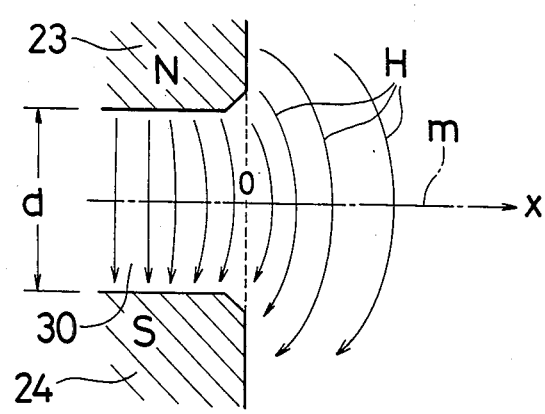
FIG. 7 is a schematic diagram of magnetic field of the apparatus shown in FIG. 4.
Figure 8:
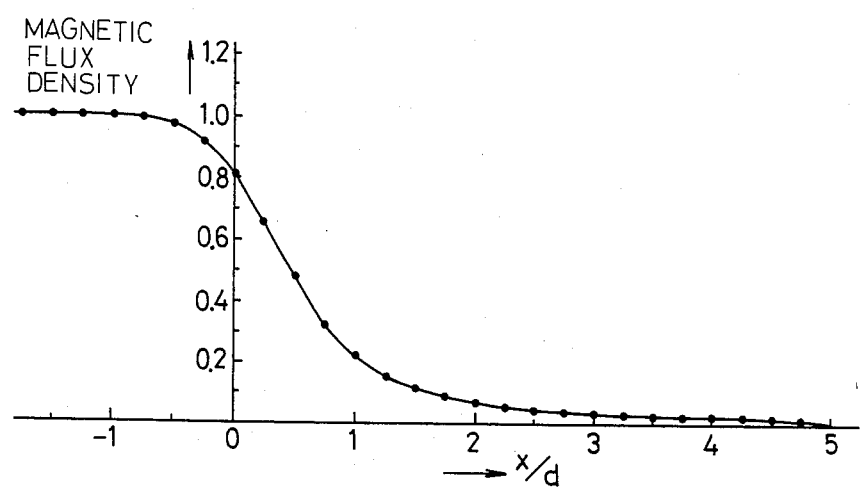
FIG. 8 shows the characteristic of position vs. magnetic flux density at the center plane of gap between magnet members.

In case the first magnet member (23) is set to the N pole while the second magnet member (24) to the S pole, the magnetic field (H) as shown in FIG. 7 is formed. When both magnet members (23), (24) are disposed symmetrically to each other, the magnetic field (H) becomes perpendicular to the center plane (m) at the center plane (m) of gap (30). The magnetic flux density at the center plane (m) as shown in FIG. 8 can be obtained when the magnetic flux density at the center of gap (30) is 1.0, height of gap (30) is d, the end surface position x of both magnet members (23), (24) is set to 0 (x=0), and the direction toward the magnet members (23) (24) is considered as the positive direction of x.

Figure 9:
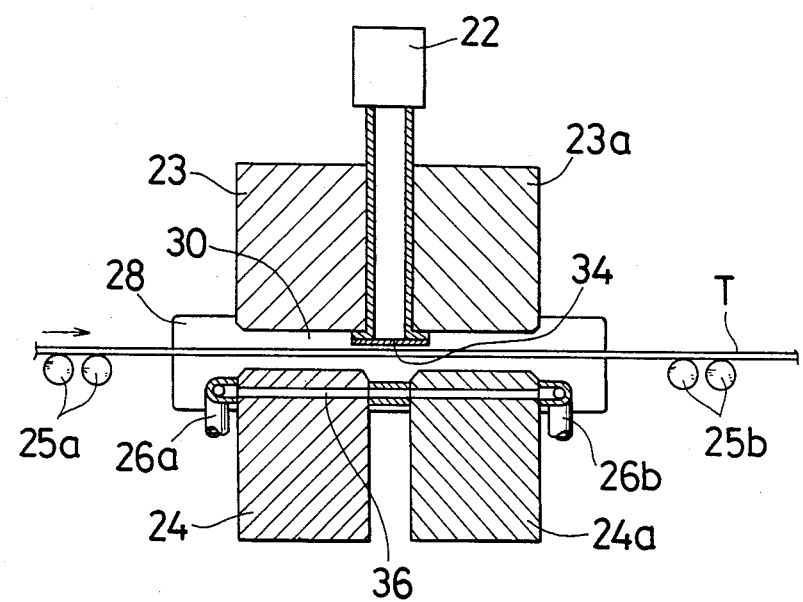
FIG. 9 is another embodiment equivalent to FIG. 4.

The film supporting/shifting rollers (25a) (25b) supportingly shift the film (T), keeping the center plane (m) from the side of magnet members (23) (24) where the electron beam source (22) is provided to the side where it is not provided. Therefore, when the unhardened magnetic layer is formed on the film (T), the magnetic particles are sharply oriented vertically within the gap (30). At the outside of gap (30), the magnetic field becomes weak but since it is sufficient for keeping vertical orientation of magnetic particles already oriented vertically, the film is hardended by electron beam irradiation while the vertical orientation is being maintained. After all, the suitable vertical magnetic film can be obtained. In FIG. 9 is another embodiment of apparatus equivalent to FIG. 4 but it has another pair of first and second magnet members (23a) (23b) on the other side of the electron beam source (22) by which efficient hardening of magnetic layer may be achieved.

What is claimed is:

1. An electron beam irradiation appartus for simultaneously (a) irradiating a target comprising a substrate and magnetic particles with an electron beam and (b) orienting the axis of easy magnetization of the magnetic particles in a direction perpendicular to the substrate, said apparatus comprising an electron beam source which is capable of generating an electron beam and irradiating it in one direction, a first magnet member having a through hole and being disposed to allow the electron beam irradiated from said electron beam source to pass therethrough to the target, means for maintaining the through hole under vacuum, a second magnet member which is disposed opposite the first magnet member across a gap which allows the target to pass therethrough and which second magnet member has a polarity different from that of the first magnet member, the two magnet members coacting to produce a magnetic field in the gap, a target supporting/shifting means which allows the target to pass through said gap perpendicular to the flux of the magnetic field, and cooling means which cools both magnet members, the gap between the first and second magnet members being from 5 to 100 millimeters.

2. As apparatus according to claim 1 wherein the electron beam source, the first magnet member, and the second magnet member are linearly disposed.

3. An apparatus according to claim 1 wherein the through hole of the first magnet member has the aperture area which allows 20% or more of electron beam irradiated from the electron beam source to pass.

4. An apparatus according to claim 3 wherein the through hole of the first magnet member has an aperture area which allows 30-100% of the electron beam irradiated from the electron beam source to pass.

5. An apparatus according to claim 1 wherein the first and second magnet members have an intensity of magnetic poles which generates a magnetic field of 50-20,000 Gauss in the gap formed between both magnet members.

6. An apparatus according to claim 1 wherein the first and second magnet members are electromagnet members.

7. An apparatus according to claim 1 wherein the first and second magnet members are permanent magnet members.

8. An apparatus according to claim 1 wherein the first and second magnet members respectively have a bored refrigerant flowing hole.

9. An apparatus according to claim 8 wherein the cooling emans causes a refrigerant to flow through the refrigerant flowing holes bored to the first and second magnet members.

10. An apparatus according to claim 1 wherein the target supporting/shifting means causes a film carrying a magnetic paste containing dispersed magnetic particles to pass through the gap continuously between the magnet members.

* * * * *

UNITED STATES PATENT AND TRADEMARK OFFICE
CERTIFICATE OF CORRECTION

PATENT NO.  : 4,642,467
DATED       : Feb. 10, 1987
INVENTOR(S) : Masakatsu Yamawaki et al.

It is certified that error appears in the above-identified patent and that said Letters Patent is hereby corrected as shown below:

Column 1, line 28: "limitated" should read --limited--;
Column 1, line 44: "68816/1984" should read --68826/1984--;
Column 3, line 47: after "air" insert a comma;
Column 5, line 23: after "vacuum" insert a comma;
Column 5, line 28: after "holes" insert a comma;
Column 6, line 57: "emans" should read --means--.

Signed and Sealed this

Twenty-sixth Day of January, 1988

*Attest:*

DONALD J. QUIGG

*Attesting Officer*  *Commissioner of Patents and Trademarks*